(12) United States Patent
Kamath et al.

(10) Patent No.: US 6,317,331 B1
(45) Date of Patent: Nov. 13, 2001

(54) WIRING SUBSTRATE WITH THERMAL INSERT

(75) Inventors: Sundar Kamath, San Jose; David Chazan, Palo Alto; Solomon I. Beilin, San Carlos, all of CA (US)

(73) Assignee: Kulicke & Soffa Holdings, Inc., Willow Grove, PA (US)

( * ) Notice: Subject to any disclaimer, the term of this patent is extended or adjusted under 35 U.S.C. 154(b) by 0 days.

(21) Appl. No.: 09/375,175

(22) Filed: Aug. 16, 1999

Related U.S. Application Data
(60) Provisional application No. 60/097,066, filed on Aug. 19, 1998.

(51) Int. Cl.[7] .................................................. H05K 1/18
(52) U.S. Cl. .......................... 361/760; 361/765; 361/807; 361/809; 174/250; 174/255; 257/737; 257/738; 257/782; 257/783; 228/124.5; 428/210
(58) Field of Search .................................... 361/760, 765, 361/796, 801, 807, 809, 741; 174/257, 250, 255, 258; 257/667, 737, 738, 782, 783, 788, 789; 228/124.5, 225, 230; 428/210

(56) References Cited

U.S. PATENT DOCUMENTS

| | | | |
|---|---|---|---|
| 4,711,804 | * 12/1987 | Burgess | 428/210 |
| 5,153,384 | 10/1992 | Iijima et al. | 174/257 |
| 5,326,671 | 7/1994 | Brown et al. | 430/311 |
| 5,383,093 | * 1/1995 | Nagasaka | 361/771 |
| 5,571,608 | * 11/1996 | Swamy | 428/246 |
| 5,804,771 | * 9/1998 | McMahol et al. | 174/255 |
| 5,834,848 | * 11/1998 | Iwasaki | 257/778 |
| 5,939,783 | * 8/1999 | Laine et al. | 257/702 |
| 5,991,160 | * 11/1999 | Lumbard | 361/760 |
| 6,014,317 | * 1/2000 | Sylvester | 361/760 |
| 6,020,629 | * 2/2000 | Farnworth et al. | 257/686 |

FOREIGN PATENT DOCUMENTS

| | | | |
|---|---|---|---|
| 0 605 090 A1 | 7/1994 | (EP) | H01L/23/316 |
| 0 260 857 A2 | 3/1988 | (EP) | H01L/23/48 |
| 0 926 929 A1 | 6/1999 | (EP) | H05K/1/02 |
| WO 98/18302 | 4/1998 | (WO) | H05K/1/02 |

OTHER PUBLICATIONS
"Multilayer Polymer Substrate for Direct Chip Attachment," *IBM Technical Disclosure Bulletin*, vol. 32, No. 3B, pp. 214–215 (Aug. 1989).

\* cited by examiner

*Primary Examiner*—Leo P. Picard
*Assistant Examiner*—David Foster
(74) *Attorney, Agent, or Firm*—Townsend and Townsend and Crew LLP

(57) ABSTRACT

A wiring substrate with reduced thermal expansion. A wiring substrate, such as a laminated PWB, thin film circuit, lead frame, or chip carrier accepts an integrated circuit, such as a die, a flip chip, or a BGA package. The wiring substrate has a thermal expansion reduction insert in a thermal expansion stress region where the integrated circuit is mounted. The thermal expansion reduction insert may extend a selected distance from the edge or edges of the integrated circuit attachment area, or stop a selected distance from the edge or edges of the integrated circuit attachment area, or be essentially equal to the integrated circuit attachment area. The thermal expansion reduction insert reduces the thermal expansion of the wiring substrate in the region that is joined to the integrated circuit, thus reducing thermal stress between components of the wiring substrate-integrated circuit assembly. In a specific embodiment, the wiring substrate is a laminated printed wiring board with the thermal expansion reduction insert in a layer next to an outer layer to which the integrated circuit is joined (mounted). In a further embodiment the thermal stress reduction insert is a CIC insert or a copper-molybdenum insert. In an alternative embodiment, the wiring substrate is a thin film substrate or a VLSI substrate.

14 Claims, 3 Drawing Sheets

WIRING SUBSTRATE WITH THERMAL INSERT

CROSS-REFERENCES TO RELATED APPLICATIONS

This application claims priority from U.S. Provisional Application Ser. No. 60/097,066, entitled ISOLATED FLIP CHIP OR BGA TO MINIMIZE INTERCONNECT STRESS DUE TO THERMAL MISMATCH, by Sundar Kamath and David Chazan, filed Aug. 19, 1998, the disclosure of which is incorporated herein by reference. This application is being filed concurrently with U.S. Utility application Ser. No. 09/375,172, entitled ISOLATED FLIP CHIP OR BGA TO MINIMIZE INTERCONNECT STRESS DUE TO THERMAL MISMATCH, by Sundar Kamath, David Chazan, Jan Strandberg and Solomon Beilin, the disclosure of which is incorporated herein by reference.

BACKGROUND OF THE INVENTION

A major problem facing manufacturers of wiring substrates, such as printed wiring boards ("PWBs"), chip carriers, and VLSI substrates, is the management of thermal expansion stresses between the materials of the substrate, in the case of a laminated substrate, and between the materials of the substrate and components mounted on the substrate.

Thermal stresses can arise in at least two situations. One situation is when a thermal gradient is present. A higher temperature in one area of the substrate, such as underneath a heat source, can cause thermal expansion relative to a cooler area of the substrate, even if the substrate is made of a single material. The effects of this situation can often be mitigated by slowly changing temperature, thus lowering the thermal gradient.

A second situation is when materials with different coefficients of thermal expansion ("CTE") are used. One material then expands and contracts at a different rate (typically expressed as a dimensionless coefficient, e.g. mm/mm, per degree of temperature) than the other as the temperature changes. Differential CTEs can cause problems regardless of the rate at which the materials are heated or cooled. If the materials are bonded or otherwise attached together, thermal stress is generated when the temperature changes. This stress can result in deformation (warping) or even fracture of the material, in order to relieve the stress.

For example, PWBs are typically formed by laminating several layers of different materials together. Conductive layers, such as copper layers patterned according to a desired wiring layout, are typically separated by, and laminated to, dielectric layers that provide electrical insulation between the conductive layers. The dielectric layers are typically polymeric resins, such as epoxy resins, including fiber-reinforced resins. The dielectric layers often have a CTE of about 50–70 ppm/° C., while the metals used in the conductive layers have a CTE of about 16–17 ppm/° C. Thus, a heat source placed on a PWB or similar wiring substrate can create thermal stress.

The increased complexity of contemporary integrated circuits affects the problems arising from thermal stress in many ways. First, the high device count on very-large-scale integrated circuit (VLSI") chips often means a single chip will generate more heat compared to a chip with a lower device count. The shrinking dimensions of the devices on the chips mean that the heat is often concentrated in a smaller area. Some ICs generate over 10 W/cm$^2$. The shrinking dimensions also mean that the traces on the chip are finer pitch and the contact pads on the chip also have finer pitch, not to mention that the number of contact pads has substantially increased. Finally, the overall dimensions of VLSI chips have increased in many cases. The increased dimensions result in a greater total expansion or contraction, which can lead to higher thermal stress.

A variety of technologies have been developed to address the finer contact pitch and increased number of contacts. Examples include ball-grid arrays ("BGAs"), which are packaged chips with an array of bumps, typically solder dots, on one surface of the package. The package may include a chip carrier or lead frame, with the actual semiconductor chip bonded to the carrier and the electrical contacts brought from the IC chip to the balls of the BGA. Another example are known as "flip chips", which are similar to BGA packages in that bumps, typically of solder, eutectic, or conductive adhesive, are formed over contact pads on the IC chip. The chip is then "flipped" onto a wiring substrate and bonded. Flip-chip is usually reserved to describe a type of direct chip attach, even though it is very similar to the packaged BGA process.

Unfortunately, the IC package or flip chip may be made of a material, such as plastic, ceramic, or semiconductor, with a different CTE than any of the materials in the wiring substrate. To complicate matters, the finer pitch of the contact array typically means a finer wiring pattern must be used on the wiring substrate. The finer wires are not as strong as wider wires would be, and thus are more susceptible to breakage when subjected to stress. Similarly, if a shear stress develops between the IC and the substrate, a smaller solder ball will have less strength to resist the stress (including work hardening), and may fail at the joint, or may crack. A particularly insidious aspect of such failures is that an electrical contact may be established at one temperature, and not at another, as thermal expansion and contraction brings the cracked or broken halves of the electrical path together and apart.

One technique that has been used to improve the reliability of BGAs attached to a PWB is to underfill the BGA. Underfilling typically involves applying a liquid to an edge or edges of the BGA, the liquid being wicked under the BGA by capillary action. The liquid then solidifies, or is solidified, as through a polymerization process for example, to "glue" the BGA to the surface of PWB. The CTE of the underfill material is typically chosen to match the CTE of the material the balls of the BGA are made of, typically a solder. These CTEs are matched to reduce the chance that the underfill material will pop the BGA off the surface of the wiring substrate, break a solder joint, or fracture a solder ball. Unfortunately, the CTE of the underfill material might not be a good match for the CTE of the integrated circuit or the CTE of the PWB.

Another technique that has been used to minimize the differences in CTEs between an integrated circuit and a wiring substrate is to incorporate a CTE matching layer within the laminated structure of the PWB. The CTE matching layer generally provides a CTE that is closer to the CTE of the integrated circuit, which typically includes a silicon chip. The CTE matching layer is typically a sheet of low CTE material, such as 64% Fe-36% Ni (commonly known as "INVAR"™) or molybdenum, clad or plated with copper. The laminate layer is typically provided as a foil that is patterned according to a desired wiring pattern or is largely unpatterned for use as a ground plane or the like. A copper-INVAR-copper foil is commonly called a "CIC" foil. These foils generally extend throughout the entire laminate layer. Unfortunately, low CTE material such as CIC or copper-molybdenum is relatively expensive, compared to a standard copper foil.

Therefore, it is desirable to reduce the failures caused by thermal stress in wiring substrates and in assemblies of integrated circuits and wiring substrates. It is further desirable that the reduction of failures be achieved without inducing other undesirable consequences.

SUMMARY OF THE INVENTION

The present invention provides wiring substrate with reduced thermal expansion. A wiring substrate, such as a laminated PWB, thin film circuit, lead frame, or chip carrier accepts an integrated circuit, such as a die, a flip chip, or a BGA package. The wiring substrate has a thermal expansion reduction insert in a thermal expansion stress region proximate to the integrated circuit. In one embodiment, the thermal expansion reduction insert extends a selected distance from the edge or edges of the integrated circuit attachment area, while in another embodiment it stops a selected distance from the edge or edges of the integrated circuit attachment area. In still another embodiment, the thermal expansion area is essentially equal to the integrated circuit attachment area. The thermal expansion reduction insert reduces the thermal expansion of the wiring substrate in the region that is joined to the integrated circuit, thus reducing thermal stress between components of the wiring substrate-integrated circuit assembly.

In a specific embodiment, the wiring substrate is a laminated printed wiring board with the thermal expansion reduction insert in a layer proximate to an outer layer to which the integrated circuit is joined (mounted). In a further embodiment the thermal stress reduction insert is a CIC insert or a copper-molybdenum insert. In an alternative embodiment, the wiring substrate is a thin film substrate or a VLSI substrate.

These and other embodiments of the present invention, as well as its advantages and features, are described in more detail in conjunction with the text below and attached figures.

DESCRIPTION OF THE SPECIFIC EMBODIMENTS

The present invention provides articles of manufacture with improved thermal stress characteristics for use in wiring substrates, and methods for producing the same. As examples only, the articles of manufacture include PWBs, chip carriers, VLSI substrates, thin film substrates, IC packages, such as BGA or micro-BGA packages, and the like, as well as such substrates with an attached IC device. The IC device may be a flip chip, a packaged BGA or micro-BGA device, an IC with wire bonding pads, or the like, and may be attached to the substrate by any one of a variety of die attach methods, as are known in the art, including solder die attach, flip-chip, and BGA solder die attach, such as controlled collapse chip connection ("C4").

Figure 1A:
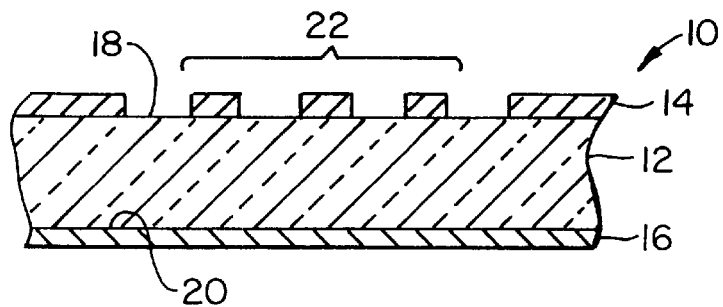
FIG. 1A is a simplified cross section of a conventional single layer printed wiring board substrate.

FIG. 1A is a simplified cross-sectional view of a conventional high density PWB sub-laminate 10. The sub-laminate is formed from a single layer of insulating material 12 such as epoxy resin, and is sold under the name FR4™ or FR5™ by NEMA. Copper sheets 14, 16 are laminated to an upper 18 and lower 20 surface of the insulating sheet, respectively. A desired conductor pattern 22 is transferred to a copper sheet, for example, by a photolithographic-etch process, as is known in the art. It is understood that a sub-laminate might have a conductor on only one side, or not at all, and that both sides may be patterned, and that other features, such as isolation for through holes. Several sub-laminates are typically laminated together to form a multi-layer PWB.

Figure 1B:
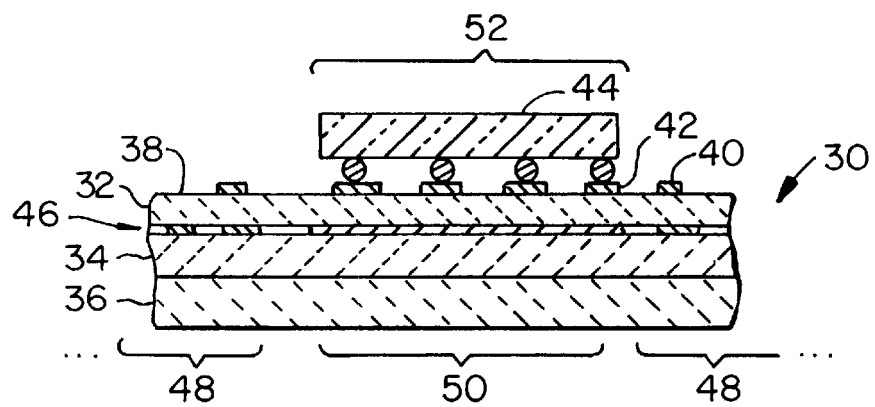
FIG. 1B is a simplified cross-sectional view of a conventional four-layer printed wiring board substrate with an attached IC.

FIG. 1B is a simplified cross-sectional view of a four-layer PWB substrate 30 according to one embodiment of the present invention (the number of layers refers to the number of metal layers, and not to the number of sub-laminate sheets). Three dielectric sheets, 32, 34, 36, such as FR4™ sheets, have been laminated to form the laminated PWB. The surface 38 of the PWB has a patterned metal layer that includes traces (wires) 40 and contact pads 42. An IC device 44 has been bonded to the contact pads. In this illustration, the IC device is a simplified representation of a BGA or micro-BGA, but other types of devices, such as a flip-chip or backside attached die could be substituted. A second patterned metal layer 46 has been formed between the first 32 and second 34 dielectric layers, as described above. The patterned metal layer includes a first portion 48, such as a copper conductive layer, and a second portion 50 of an intermediate thermal expansion material. The intermediate thermal expansion layer is a layer of material that has a CTE closer to the CTE of the IC 44 than the CTE of the PWB. For example, if the IC is a VLSI silicon chip in a plastic package, the silicon chip has a CTE of about 3 ppm/° C. The plastic of the package typically has a much higher CTE, but, being plastic, can deform in response to thermal stress. The CTE of the dielectric layer of the PWB is typically between about 50–70 ppm/° C., and the CTE of a typical copper layer is about 16.6 ppm/° C.

For example, molybdenum has a CTE of about 5 ppm/° C., which is between the CTE of the IC and the CTE of the PWB, thus it can operate as an intermediate thermal expansion layer, as could other metals, such as tungsten or a variety of stainless steels. Thus, incorporating molybdenum into the second portion of the second patterned metal layer reduces the thermal expansion of the PWB in the second region, and reduces the thermal expansion mismatch between the IC and the PWB in the attachment area 52. It is understood that the "patterned metal layer" does not have to be patterned, particularly in the region "under" the IC.

While the intermediate thermal expansion material can have a CTE between that of the IC and the PWB, it can also have a CTE less than the IC. For example, INVAR™ has a CTE of about 1 ppm/° C. Using INVAR™ or a similar material in the second region can compensate for thermal expansion in other regions, and balance thermal stresses.

A technique that incorporates a copper-INVAR-copper ("CIC") foil as an interlaminate conductive layer throughout the entire conductive layer has been tried. However, using a low CTE layer throughout a conductive layer of the PWB can create undesirable consequences. First, lowering the thermal expansion characteristics of one layer does not necessarily match the thermal expansion characteristics of the layers or a mounted device. Referring to FIG. 1B, it is seen that matching the CTE of the IC 44 to the assembly attachment region 52 is desirable. If an entire layer of the PWB laminate were INVAR™ or CIC, the thermal expansion of the IC might be higher than the thermal expansion of the PWB, for example. Thus, thermal stress can be generated because the CTE of a layer of the PWB is too low, rather than too high.

Second, an entire layer in a laminate with a low CTE can cause other problems, like warping or breakage. In practice, the PWB laminate has a composite CTE that is a rough sum of the CTEs of the layers in the laminate, adjusted by the stiffness, strength, etc., of the layers. For example, if a thin CIC layer is sandwiched between two thick FR4™ layers, the CIC layer will likely stretch or otherwise compensate for the differences in CTEs. This can cause warping of the laminate assembly and/or cracking of the dielectric layers or metal layers, especially if the metal layer is a relatively brittle material (e.g. to copper). Finally, alloys such as molybdenum and INVAR™ are relatively expensive compared to copper, thus it is desirable to minimize the use of these materials, and they generally are not as good conductors of either electricity or heat as copper.

The present invention avoids these problems by providing intermediate thermal expansion stress relief inserts in the regions of mounted ICs or other components. Thus, the CTE of the IC can be at least partially matched to the underlying PWB, or an intermediate thermal expansion layer can compensate for the thermal expansion of the layer in regions away from the IC. For example, if an INVAR™, CIC, or other low CTE material is present beneath the IC, but not throughout an inter-dielectric layer, the low CTE material will at least partially compensate for the higher (than the IC) CTE of the remainder of the layer. Thus, even though the low CTE material does not thermally expand as much as the IC, the relatively high CTE material in the same layer at least partially compensates for the difference in CTEs, and results in an thermal expansion stress region more closely matched to the CTE of the IC.

Figure 2A:
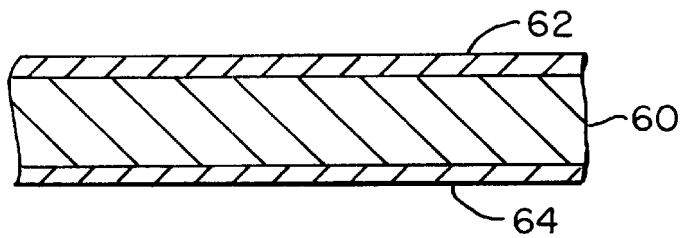
FIG. 2A is a simplified cross-sectional view of a low CTE foil.

FIG. 2A shows a simplified cross-sectional view of a layer of an intermediate thermal expansion material 60, such as INVAR™ or molybdenum, clad or plated with a copper layers 62, 64. If the second portion of the second metal layer is patterned, especially if the second portion will be carrying electrical signals, it is desirable to plate or clad one or both surfaces of the intermediate thermal expansion material with copper. The overall thickness of the material is between about 6–16 mils, with the copper layer(s) being about 1.25 mils thick, although these thickness are provided by example only. In some instances, it is desirable to choose a relatively thick intermediate thermal expansion material, i.e. 16 mils or thicker, to provide sufficient stiffness in the thermal compensation region. In these instances, the conductive layer which incorporates the intermediate thermal expansion material is preferably a ground plane, power supply plane, or other conductive plane that takes advantage of the thicker metal.

Figure 2B:
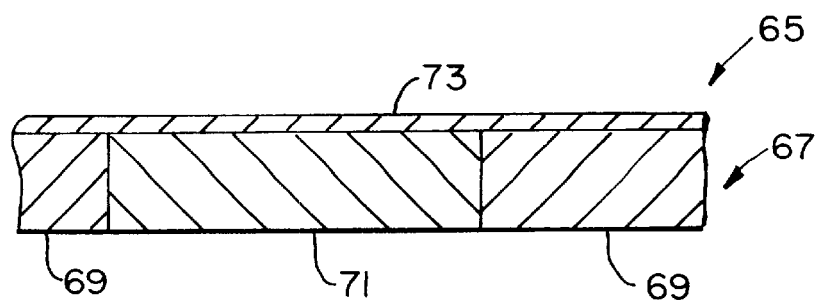
FIG. 2B is a simplified cross-sectional view of a low CTE insert in a metal foil in accordance with the present invention.

FIG. 2B is a simplified cross-sectional view of a metal layer 65 for use in a PWB laminate according to the present invention. A plating or cladding layer 67 includes a copper portion 69 and an intermediate thermal expansion portion 71. A layer of copper 73 has been plated or clad over the underlying layers. Thus, the entire metal layer may be fabricated according to conventional photolithography-etch techniques, adapted to etch the intermediate thermal expansion material, if necessary. In this way, good electrical conductivity is maintained between the first and second portion of the conductive layer.

Figure 3:
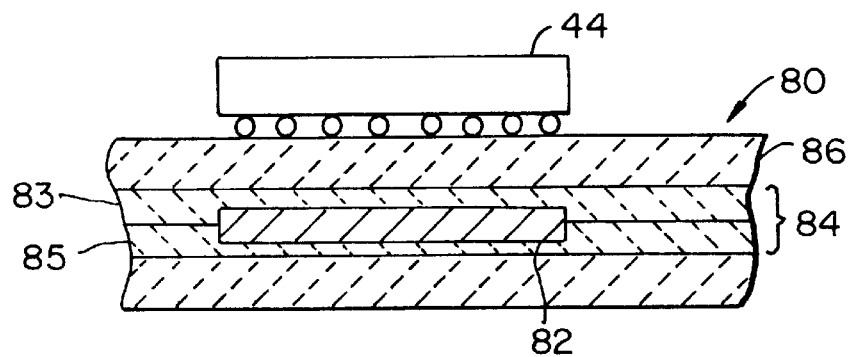
FIG. 3 is a multi-layer PWB with a low CTE insert beneath an IC mounted on the PWB, according to an embodiment of the present invention.

FIG. 3 is a simplified cross-sectional view of a PWB 80 according to another embodiment of the present invention (various patterned or unpatterned metal layers are not shown for simplicity). A thermal expansion stress compensation insert 82 is embedded in a dielectric layer 84 of the PWB laminate. Although the insert is shown in an internal layer, the insert could be placed in the outer layer 86, depending on the need for electrical contacts to the IC 44 through the outer layer, or other considerations. The insert is, for example, INVAR™ molybdenum, stainless steel, or other material that has a CTE less than the CTE of the dielectric material in the layer of the PWB, preferably less than about 9 ppm/° C. when used with an epoxy-based dielectric laminate. The dielectric layer 84 has been split and a pocket has been formed to accept the insert 82 in the two halves 83, 85 of the dielectric layer, which are subsequently laminated together. In this embodiment, the insert is not a patterned conductive layer, and need not even be a conductor. The insert could be of other material, such as silicon, including polycrystalline silicon, fused silica, boron carbide, silicon carbide, alumina-based ceramic, or the like.

Figure 4A:
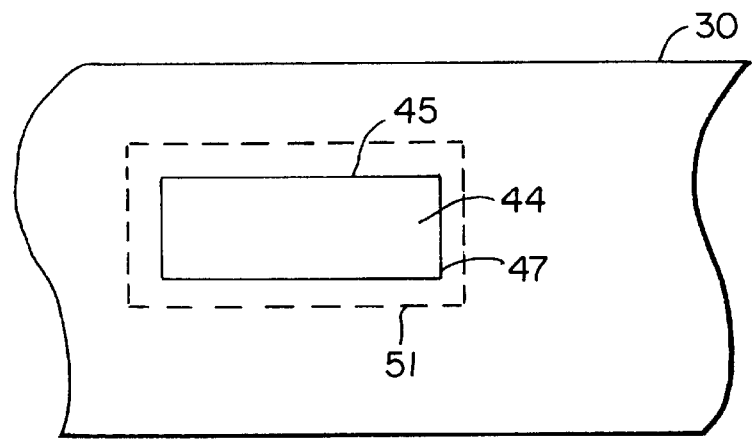
FIG. 4A is a simplified top view of a PWB with a mounted IC illustrating a thermal expansion stress region.

FIG. 4A is a simplified top view of an IC 44 mounted on a PWB substrate 30. The IC is rectangular with a long side 45 and a short side 47. A dotted line 51 represents the thermal expansion compensation area, but it is understood that this area could be equal to the perimeter of the IC 44, or even lie within the perimeter of the IC. Generally, the thermal stress compensation area does not extend more than about 8 mm from the edge of the mounted IC, although this dimension is chosen according to several criteria, including the relative CTEs of the IC, PWB, intermediate thermal expansion material, and the stiffness and elasticity of the various layers and materials.

Figure 4B:
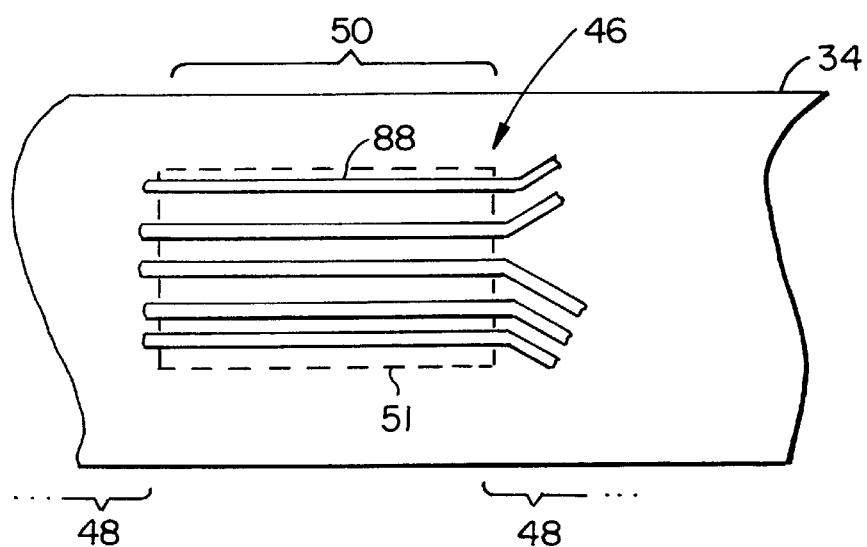
FIG. 4B is a simplified top view of a laminate with a patterned low CTE conductive insert according to an embodiment of the present invention.

FIG. 4B is a simplified view of a portion of a patterned metal layer 46 with an intermediate thermal expansion region 50 and a copper region 48. The metal layer is a metal layer or foil according to FIG. 2B, above, that has been patterned to create traces 88 within the thermal expansion compensation area, represented by the dotted line 51. The traces generally run along the long axis of the IC shown in FIG. 4A in the thermal expansion compensation area, providing superior thermal compensation effect. Outside the thermal expansion compensation, the traces may remain straight, or diverge, as shown.

Figure 5:
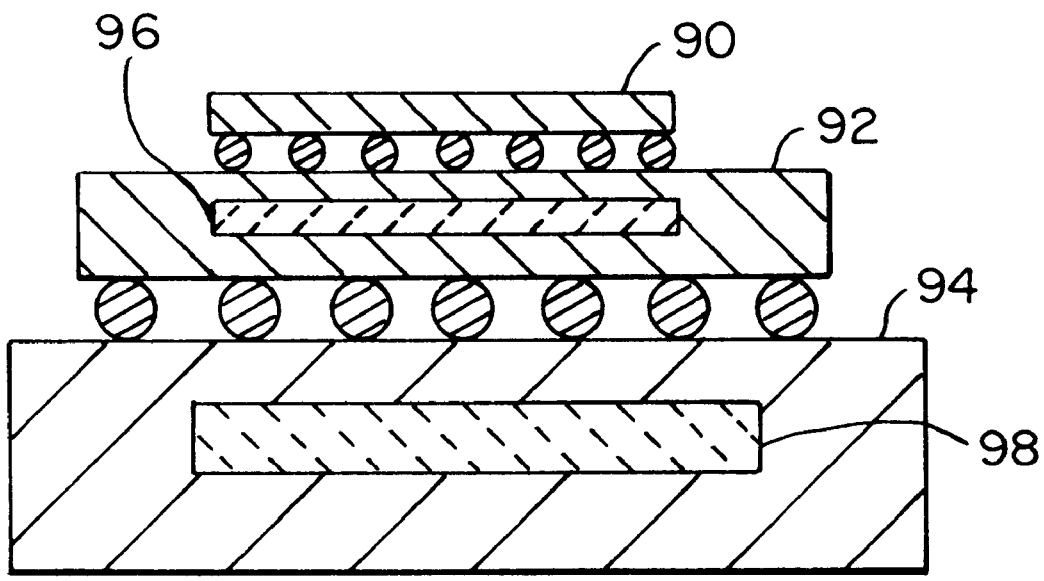
FIG. 5 is a simplified cross-sectional view of a multi-chip module mounted on a PWB according to another embodiment of the present invention.

FIG. 5 is a simplified cross-sectional view of a first IC 90 mounted on a second IC 92 mounted on a PWB 94. The second IC has a thermal expansion reduction insert 96, and the PWB also has a thermal expansion reduction insert 98.

The thermal expansion reduction insert 96 in the second IC 92 can be a thermal matching material, such as molybdenum, or a thermal compensation material, such as INVAR™. While the thermal expansion reduction insert 98 in the PWB 94 primarily reduces the thermal expansion stress mismatch between the PWB 94 and the second IC 92, the thermal expansion reduction insert 96 in the second IC 92 can reduce the thermal stress in the IC chip (not shown) in the second IC, as well as reduce the thermal expansion mismatch stress between the first IC 90 and the second IC 92. Thermal expansion stress mismatch can arise between the first and second IC because of different operating temperatures, or because of different CTEs of the two components.

The thermal expansion reduction insert 96 in the second IC can reduce the thermal stress in the IC chip by adding strength to the IC chip, or by maintaining or loading the IC chip in compression. For example, if the insert is INVAR™ and a silicon IC chip is mounted to the INVAR™ insert, when the assembly heats up the silicon chip will tend to expand more than the INVAR™. The insert can thus hold the IC chip in compression. The PWB, as described above, tends to expand more than the INVAR™ or the IC, and thus will generate tensile-type stress in the IC. The compressive stress provided by the insert will work against this tensile stress, and it is possible to balance the stresses so that the chip in the IC has little, if any, thermal stress at an operating temperature.

Additionally, the thermal expansion reduction insert 96 in the second IC 92 can reduce stress, including bonding stress, between the first IC 90 and the second IC 92. For example, the first IC may be a flip-chip thin film substrate on ceramic or sapphire. In such an instance, the CTE of the first IC would be lower than the CTE of the second IC, if the second IC was a silicon VLSI substrate, for example.

Having fully described various embodiments of the present invention, other equivalent or alternative structures and methods will be apparent to those of ordinary skill in the art. For example, while embodiments have been described with laminated layers of epoxy material, it is understood that other materials could be used in one or several layers of the lamination. Other materials could include metal layers, such as are used in chip carriers and lead frames, glass-filled fluoropolymer layers, and alumina-based ceramic layers, to name but a few. Accordingly, the scope of the invention should not be limited by the specific embodiments described above, but rather by the following claims.

What is claimed is:

1. A multi-layer wiring substrate comprising:
    an outer layer with an outer surface and an inner surface, the outer surface having an attachment area for mounting an integrated circuit onto the outer surface; and
    a conductive layer laminated to the inner surface of the outer layer, the conductive layer having a first region with a first coefficient of thermal expansion and a second region with a second coefficient of thermal expansion, the second coefficient of thermal expansion being less than the first coefficient of thermal expansion, wherein the second region corresponds to the attachment area.

2. The multi-layer wiring substrate of claim 1 wherein the first region of the conductive layer comprises copper and the second region of the conductive layer comprises a metal with a coefficient of thermal expansion less than about 9 ppm/° C.

3. The multi-layer wiring substrate of claim 2 wherein the second region of the conductive layer comprises molybdenum or an alloy having about 64% iron and 36% nickel.

4. The multi-layer wiring substrate of claim 1 wherein the attachment area has a long side and a short side and the conductive layer is patterned to form traces, the traces running essentially parallel to the long side of the attachment area.

5. The multi-layer wiring substrate of claim 1 wherein the conductive layer is configured as a ground plane or a power supply plane.

6. A multi-layer wiring substrate comprising:
    a laminate layer of epoxy-based dielectric material with an outer surface and an inner surface, the outer surface having an attachment area for mounting an integrated circuit onto the outer surface; and
    a conductive layer laminated to the inner surface of the laminate layer, the conductive layer having a first region comprising copper and a second region comprising a metal with a second coefficient of thermal expansion less than about 9 ppm/° C., wherein the second region corresponds to the attachment area and the first region corresponds to an area adjacent the attachment area.

7. A multi-layer metal foil for use in a wiring substrate, the foil comprising:
    a first portion of the foil comprising copper of a first thickness;
    a second portion of the foil comprising a metal having a coefficient of thermal expansion less than about 9 ppm/° C., the second portion having a second thickness, the second thickness being essentially equal to the first thickness; and
    a low-conductivity layer overlying the first portion and the second portion, and mechanically and electrically coupling the first portion to the second portion.

8. The foil of claim 7 wherein the low-conductivity layer comprises copper and the second portion comprises an alloy of about 64% iron and 36% nickel or molybdenum.

9. The foil of claim 7 wherein a total thickness of the foil is between about 6–16 mils.

10. An integrated circuit comprising:
    a semiconductor chip having a first coefficient of thermal expansion;
    a package having a ball array side and a chip attachment side, the chip attachment side being configured to accept a second integrated circuit, the semiconductor chip being disposed in the package between the ball array side and the chip attachment side; and
    a thermal expansion reduction insert disposed in the package between the semiconductor chip and the chip attachment side, the thermal expansion reduction insert having a second coefficient of thermal expansion, the second coefficient of thermal expansion being less than the first coefficient of thermal expansion.

11. The integrated circuit of claim 10 wherein the thermal expansion reduction insert comprises an alloy of about 64% iron and 36% nickel.

12. An electronic assembly comprising:
    a printed wiring substrate having a surface with a chip attachment area, a dielectric layer having a first coefficient of thermal expansion, and a first thermal expansion reduction insert opposite the chip attachment area, the first thermal expansion reduction insert having a second coefficient of thermal expansion, the second coefficient of thermal expansion being less than the first coefficient of thermal expansion;

a first integrated circuit, the first integrated circuit being mounted on the surface of the printed wiring substrate in the chip attachment area, the first integrated circuit including a semiconductor chip having a third coefficient of thermal expansion and a second thermal expansion reduction insert having a fourth coefficient of thermal expansion, the fourth coefficient of thermal expansion being less than the third coefficient of thermal expansion, and a second chip attachment area on a surface of the first integrated circuit; and a second integrated circuit mounted on the second chip attachment area of the first integrated circuit.

13. The assembly of claim 12 wherein the first integrated circuit is mounted to the printed wiring substrate with a ball array and wherein the second integrated circuit is mounted to the first integrated circuit with a ball array.

14. A multi-layer wiring substrate comprising:

a laminate layer of epoxy-based dielectric material with an outer surface and an inner surface, the outer surface having an attachment area for mounting an integrated circuit onto the outer surface; and a conductive layer laminated to the inner surface of the laminate layer, the conductive layer having a first region comprising copper and a second region comprising a metal with a second coefficient of thermal expansion less than about 9 ppm/° C., wherein the second region corresponds to an attachment area inside a perimeter area of a mounted integrated circuit, and the first region corresponds to an area adjacent the attachment area.

* * * * *